(12) United States Patent
Emerson

(10) Patent No.: US 7,812,354 B2
(45) Date of Patent: Oct. 12, 2010

(54) ALTERNATIVE DOPING FOR GROUP III NITRIDE LEDS

(75) Inventor: David T. Emerson, Chapel Hill, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 11/567,236

(22) Filed: Dec. 6, 2006

(65) Prior Publication Data
US 2008/0135855 A1    Jun. 12, 2008

(51) Int. Cl.
*H01L 29/22* (2006.01)
(52) U.S. Cl. .............. 257/79; 257/85; 257/94; 257/96; 257/103; 257/E33.033
(58) Field of Classification Search .......... 257/79, 257/85, 94, 98, 103, E33.003
See application file for complete search history.

(56) References Cited

U.S. PATENT DOCUMENTS

| | | | |
|---|---|---|---|
| 5,652,434 A | 7/1997 | Nakamura et al. | |
| 5,773,933 A | 6/1998 | Yoder | |
| 5,998,232 A | 12/1999 | Maruska | |
| 6,046,464 A * | 4/2000 | Schetzina | 257/96 |
| 6,858,877 B2 | 2/2005 | Kawaguchi et al. | |
| 6,998,690 B2 | 2/2006 | Nakamura et al. | |
| 2003/0006430 A1 * | 1/2003 | Shibata et al. | 257/200 |
| 2003/0209705 A1 * | 11/2003 | Emerson et al. | 257/14 |
| 2006/0163605 A1 * | 7/2006 | Miyahara | 257/103 |

* cited by examiner

*Primary Examiner*—Cuong Q Nguyen
*Assistant Examiner*—Trang Q Tran
(74) *Attorney, Agent, or Firm*—Moore & Van Allen PLLC; Steven B. Phillips

(57) ABSTRACT

A light emitting diode is disclosed that is formed in the Group III nitride material system. The diode includes respective n-type and p-type layers for current injection and light emission. At least one n-type Group III nitride layer in the diode has dopants selected from the group consisting of elements with a larger atomic radius than silicon and elements with a larger covalent radius than silicon, with germanium and tellurium being exemplary.

22 Claims, 1 Drawing Sheet

ALTERNATIVE DOPING FOR GROUP III NITRIDE LEDS

BACKGROUND

The present invention relates to electronic devices in which epitaxial layers of different materials are grown on substrates and in particular relates to Group III nitride layers that are formed, at least initially, on dissimilar substrates such as silicon carbide and sapphire as precursors to devices including, but not limited to, light emitting diodes (LEDs).

The term light emitting diode is used herein in a relatively broad sense to describe those semiconductor devices that produce photons when a current is applied across the device, and typically, although not exclusively, across a p-n junction that is formed by adjacent layers of p-type and n-type materials. The general structure and operation of light emitting diodes is well understood in this art and is described in numerous well-understood and widely available references.

Light emitting diodes have found application in a wide variety of devices and circumstances. Among other applications, they are used for indicator lights, in simple alphanumeric display devices (e.g., calculators), in full color video display screens, as backlighting for other types of displays (e.g., in conjunction with liquid crystal displays) and more recently as illumination sources. As solid-state devices, they share the advantages of light weight, relatively inexpensive cost, small size, generally high reliability and long lifetime.

The Group III nitride compounds have become increasingly of interest in the production of light-emitting diodes and related photonic devices. Group III refers to the third group of the periodic table of the elements and includes (among other elements) gallium (Ga), aluminum (Al), and indium (In). When these elements are formed in binary, ternary, or quaternary compositions, they exhibit desirable semiconductor properties. In particular, the Group III nitrides have relatively large band gaps, which gives them the capacity to emit relatively high energy photons, which in turn means that they can produce photons in the green, blue, violet, and ultraviolet portions of the electromagnetic spectrum. This favorably distinguishes them from materials such as gallium phosphide that have smaller band gaps and that thus emit longer wavelength, lower energy photons in the red and yellow portions of the spectrum.

Blue (and higher-frequency) emitting materials are of particular interest because they can be combined with red-emitting and green-emitting materials to produce white light. Stated more fundamentally, producing white light from LEDs (and in the absence of other materials such as phosphors) requires a combination of blue, red, and green light.

Additionally, the relatively high energy of blue, violet or ultraviolet photons can help stimulate certain phosphors, which in turn produce light in a different, more desired frequency. For example, photons in the blue portion of the visible spectrum can typically excite certain phosphors which emit yellow frequencies. When the frequency of the emitting semiconductor and the phosphor are properly selected, the combination of blue and yellow light can produce white light.

Additionally, controlling the composition (atomic fractions) of certain Group III nitrides (e.g. InGaN) determines the particular wavelength of the emitted photons. Thus, in a certain sense the Group III nitride compositions can be tuned to produce emissions of desired colors.

As another favorable characteristic, the Group III nitrides are "direct" emitters meaning that all of the energy produced from an electronic transition is emitted as a photon. This is in contrast to other wide band gap materials such as silicon carbide in which the transitions are indirect; i.e., the transition produces some energy in the form of a photon and some energy as vibrations. Accordingly, other factors being equal, direct emitters such as the Group III nitrides produce light more efficiently than do indirect emitters such as silicon carbide.

The wide bandgap advantages of Group III nitrides are not, however, limited to light emission or to devices such as LEDs. Wide bandgap semiconductors have advantages in many types of semiconductor electronic devices including power transistors and high frequency devices such as MESFETs and HEMTs.

To date, however, the growth of bulk crystals of Group III nitrides remains an academic exercise rather than a practical reality. Thus, practical devices that incorporate Group III nitrides for light emitting (or other) purposes typically incorporate epitaxial layers of Group III nitrides on substrates formed of other materials. In the field of light-emitting diodes (as well as some other devices) these substrate materials tend to be either silicon carbide (SiC) or sapphire ($Al_2O_3$).

Sapphire offers the advantage of being mechanically strong and highly transparent. Sapphire cannot, however, be conductively doped. Thus, devices formed on sapphire substrates cannot be arranged in a "vertical" orientation. As known to those familiar with this art, a vertical orientation is one in which the electrical (ohmic) contacts are at axially opposite ends of the device. Vertical devices offer certain engineering and size advantages in comparison to "horizontal" devices in which the ohmic contacts must be arranged in side by side geometry because of the lack of a conductive substrate. Generally speaking, for the same effective device area, the footprint of a vertical device is smaller than the footprint of a horizontal device.

Silicon carbide offers the advantage of being conductive, but is more difficult to make transparent, particularly when doped to obtain the desired conductivity. Nevertheless, because some devices purposely incorporate insulating substrates, both types of substrates (sapphire and silicon carbide) are of theoretical and commercial interest for LEDs and other devices.

As a structural factor, however, the unit cell dimensions of the Group III nitrides differ somewhat from that of silicon carbide or sapphire; e.g., hexagonal GaN is 3.19 Å, hexagonal SiC is 3.08 Å and sapphire is 2.75 Å. Thus, growing Group III nitride layers on silicon carbide or sapphire substrates always includes a lattice mismatch. In turn, this lattice mismatch produces a resulting strain in the Group III nitride layer. Such strain normally falls into two categories, tension and compression. In layman's terms, a layer under tension has been stretched somewhat to match the substrate. A layer under compression has been squeezed to match the substrate. When a thin layer of Group III nitride is placed on one of these substrates, the resulting strain is smaller and less relevant. As the Group III nitride layer becomes thicker, however, the strain normally increases and causes additional problems such as dislocations and cracking.

Furthermore, although the issues of tension and compression generally arise in the context of adjacent layers that are different from one another, impurities—including dopants—can cause strain even in otherwise homogeneous materials and even in the absence of an adjacent different material.

Accordingly, Group III nitride device structures on SiC or sapphire substrates typically include one or more Group III nitride buffer (i.e., lattice transition) layers between the substrate and the active layers. These transition layers typically have a composition different from the active layers, but with a lattice matched more closely to that of the relevant substrate or deposited in such a way that strain (thermal or mechanical) associated with the subsequent layer deposition is compensated by the properties of the buffer layer. In order to produce vertical devices on conductive substrates (e.g., SiC), any such buffer layers are typically produced to be conductive and thus include dopants. For number of reasons, however, such dopants can increase the resulting strain in a crystal layer. In many circumstances, the Group III nitrides are normally doped with silicon. In turn, silicon has a tendency to alter the lattice constant of the doped Group III nitride in a manner that increases strain and unfavorably promotes cracking in the epitaxial layer stack. As any of these transition layers become thicker, the defects and stress problems generated by the layer-substrate mismatch will tend to increase. As noted above, thinner transition layers can be pseudomorphic or more nearly pseudomorphic; i.e., they are sufficiently elastic to match the substrate with minimal resulting strain and minimal defect formation. As the layers grow thicker, however, the crystal structure of the epilayer reduces the elasticity and increases the resulting strain. If the strain becomes too great, defects are formed in the epitaxial layer stack in order to reduce it. These can be either micro-scale defects such as point or line defects or more gross defects such as epitaxial layer cracking or delamination. Either class of defects can be detrimental to device performance and overall yield of the LED manufacturing process.

Thus, from the strain standpoint, thinner transition layers would normally be preferred. In some current device technology, however, the dissimilar substrate (e.g. SiC or sapphire) is eventually removed in order to produce the final structure. In those cases, the transition layer serves at least three purposes: (i) it provides the crystal transition noted above while the substrate is present, (ii) it provides a structural support for the active layers after the substrate has been removed, and (iii) it provides a path for lateral current spreading from the n-contact to the device. When serving as a structural support, a thicker transition layer is sometimes desired or necessary rather than a thinner one. Thicker layers help provide the required support and manufacturing tolerance during the production of the finished device. As another factor, thicker epitaxial layers can help in current spreading, especially when doped in a way that provides for low resistivity.

Accordingly, a need exists for techniques and structures that favorably permit or include thicker transition layers with high doping levels while minimizing the disadvantageous strain that can accompany such thicker layers.

SUMMARY

In one aspect, the invention is a light emitting diode formed in the Group III nitride material system that includes respective n-type and p-type layers for current injection and light emission. In this aspect, the invention includes at least one n-type Group III nitride layer in which the dopants are selected from the group consisting of elements with a larger atomic radius than silicon and elements with a larger covalent radius than silicon.

In another aspect, the invention includes at least one n-type Group III nitride layer in which the dopants are selected from the group consisting of germanium and tellurium.

In another aspect, the invention is a light emitting diode that includes a silicon carbide substrate, a Group III nitride buffer structure on the silicon carbide substrate, an n-type Group III nitride epitaxial layer on the buffer structure, a Group III nitride superlattice structure on the n-type gallium nitride epitaxial layer, and at least one of any of the n-type Group III nitride layers in the diode being doped with an acceptor dopant selected from the group consisting of germanium and tellurium.

In another aspect the invention is a method of forming light emitting diodes in Group III nitride materials at higher efficiency and lower temperatures. In this aspect, the invention includes the steps of growing the respective epitaxial layers of Group III nitride material using chemical vapor deposition at temperatures below 900° C. while doping the n-type layers with a dopant selected from the group consisting of germanium and tellurium.

The foregoing and other objects and advantages of the invention and the manner in which the same are accomplished will become clearer based on the followed detailed description taken in conjunction with the accompanying drawings.

DETAILED DESCRIPTION

Figure 1:
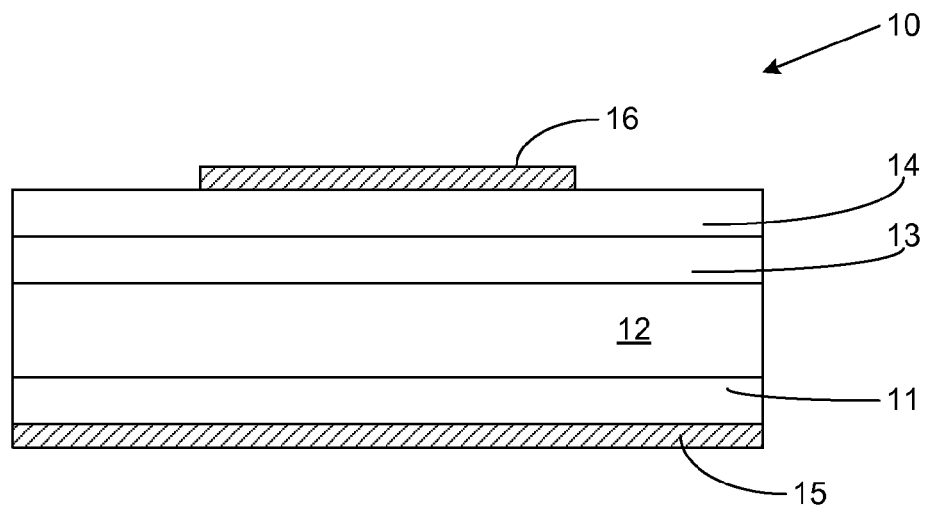
FIG. 1 is a cross-sectional schematic view of a diode according to the present invention.

In one aspect, the invention is a light emitting diode formed in the Group III nitride material system that includes respective n-type and p-type layers for current injection and light emission. In this aspect, the invention includes at least one n-type Group III nitride layer in which the dopants are selected from the group consisting of elements with a larger atomic radius than silicon and elements with a larger covalent radius than silicon, with germanium and tellurium being exemplary.

The nature and composition of the Group III nitrides are well understood in this art and will not be otherwise described in detail. In brief summary, however, active layers are typically formed of gallium nitride (GaN) or indium gallium nitride (InGaN) while buffer layers are typically formed of aluminum gallium nitride (AlGaN). Furthermore, these compositions are typically represented by formulas such as $In_xGa_{1-x}N$ and $Al_yGa_{1-y}N$ in which the variable "x" or "y" represents the atomic fraction of the element in the composition.

Although the inventors do not wish to be bound by any theory, there are recognized differences between silicon, germanium, and tellurium as elements that may contribute to the observed advantages of the invention.

Silicon and germanium are both Group IV elements. Group IV exhibits a general trend from electronegative to electropositive character with increasing atomic number. Thus, carbon (atomic number 6) is strictly nonmetallic, silicon (atomic number 14) is essentially non-metallic, germanium (atomic number 32) is metalloid and tin (atomic number 50) and lead (atomic number 82) are both metallic.

Silicon has an electronegativity of 1.90 (Pauling electronegativity), an atomic radius of 1.46 angstroms (Å) and a covalent radius of 1.17 Å (these values can differ slightly between and among reference works). Germanium has a Pauling electronegativity of 2.01, an atomic radius of 1.22 Å and a covalent radius of 1.22 Å.

In compounds, silicon typically exhibits the (IV) valence with a stereochemistry that is nearly always tetrahedral. For germanium compounds, octahedron structures can be more frequent and more important.

In contrast to silicon and germanium, tellurium falls in Group VI of the periodic table (Group 16 under the modern nomenclature). Because the electronic structure of the Group VI elements is closer to the noble gases than are the Group IV elements, the Group VI elements tend to show purely nonmetallic chemistry with the exception that tellurium will show metallic character to a very slight extent.

Additionally, although oxygen is a Group VI element, the greatest differences in the chemistry of the group are between the chemistry of oxygen and the chemistry of the remaining elements, including tellurium.

Tellurium has a covalent radius of 1.37 Å, an ionic radius of 1.42 Å and a Pauling electronegativity of 2.1.

Tellurium also differs from oxygen (as do other Group VI elements) in terms of the lack of any stable compound corresponding to carbon monoxide (CO) and nitrous oxide (NO). As noted above, the Group VI elements decrease in nonmetallic character with increase in atomic number.

The orbital structure (electronic configuration) of the elements are also significantly different. Silicon is element 14 of the periodic table with outer electrons in the 3s and 3p orbitals. In comparison, germanium has its outer electrons in the 4s and 4p orbitals, and tellurium has its outer electrons in the 5s and 5p orbitals.

Although the invention has been described primarily with respect to germanium and tellurium, it will be understood that other elements are acceptable dopants provided they offer the same beneficial criteria as germanium and tellurium in the context of doping Group III nitride layers to reduce strain. Thus, in addition to having atomic or covalent radii greater than silicon, qualifying elements will also act as an n-type dopants in the Group III nitrides, should be available in an appropriate source gas for chemical vapor deposition techniques; and must avoid pre-reacting with the other elements under Group III nitride growth conditions. The available source molecules for the element (e.g., germane is the source molecule for germanium) must be stable; the element and its source molecule should avoid memory issues in growth equipment; and the element should have a relatively low binding energy. In this regard, binding energy typically decreases in relation to increasing atomic number (and thus size), a factor which is consistent with respect to silicon, germanium, and tellurium.

With this as a background, FIG. 1 is a cross-sectional schematic view of a light emitting diode 10 according to the present invention. The diode 10 includes a substrate 11, an n-type layer 12 in which the donor impurities are germanium or tellurium, an emission layer 13, and a p-type layer 14.

In many embodiments the substrate is single crystal silicon carbide, but this is offered as being exemplary rather than necessary to the invention. The n-type Group III nitride layer 12 has acceptor dopants selected from the group consisting of germanium and tellurium.

The diode 10 further typically includes respective ohmic contacts 15 to the substrate 11 and 16 to the p-type layer 14.

Figure 2:
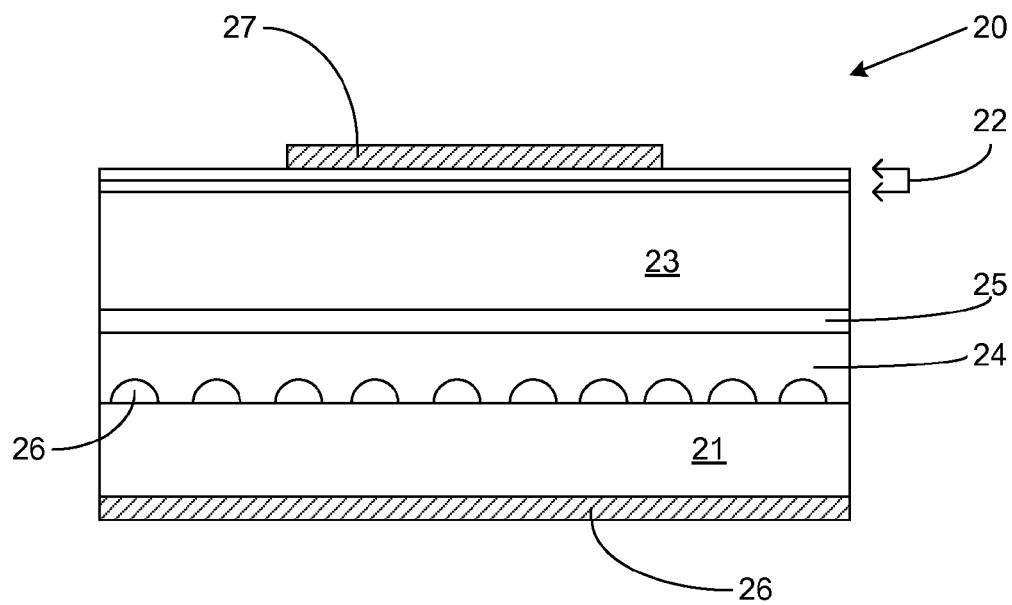
FIG. 2 is another cross-sectional schematic view of a second embodiment of a diode according to the present invention.

FIG. 2 is another embodiment according to the invention broadly designated at 20 that includes a silicon carbide substrate 21. The light emitting structure is indicated by the brackets 22 and includes a superlattice structure; i.e., a series of at least two (and usually more than two) alternating layers of materials with different lattice constants. The alternating layers may create a strain that can affect the band structure of the materials to produce desired emissions. The superlattice structure 22 is positioned on an n-type gallium nitride layer 23.

In order to provide a crystal and electronic transition between the silicon carbide substrate 21 and the n-type gallium nitride layer 23, in this embodiment the diode 20 includes an n-type aluminum gallium nitride layer 24 that is substantially homogeneous, and a graded aluminum gallium nitride layer 25 that is graded in aluminum percentage between the homogeneous aluminum gallium nitride layer 24 and the gallium nitride layer 23. In the graded layer 25, the percentage of aluminum is highest at the interface with the aluminum gallium nitride layer and the percentage of aluminum is lowest at the interface with the gallium nitride layer 23.

In some embodiments, the diode 20 can further include a plurality of dots 26 typically formed of gallium nitride or aluminum gallium nitride which additionally provide a better crystal and electronic transition from the substrate 21 to the aluminum gallium nitride layer 24.

In this embodiment any one or more of the gallium nitride layer 23, the graded aluminum gallium nitride layer 25 or the homogeneous aluminum gallium nitride layer 24, may be doped with germanium or tellurium in accordance with the present invention.

FIG. 2 also includes respective ohmic contacts 26 and 27 to the substrate 21 and to the superlattice 22. Appropriate metals for ohmic contacts to silicon carbide and the Group III nitrides are well understood in this art and can be selected by those of ordinary skill without undue experimentation. Those familiar with these devices will also recognize that because p-type Group III nitride layers are generally less conductive than similarly-doped n-type layers of Group III nitrides, the size and shape of the ohmic contact 27 will typically be more sophisticated than illustrated in FIG. 2 and that more highly doped p-type contact layers of Group III nitrides can also be included to enhance current spreading across the superlattice 22 or any other p-type layer that forms part of the active structure.

The invention is useful in any Group III nitride structure that incorporates any one or more n-type layers. Specific applications can include relatively thick light emitting diode structures such as the EZ™ diodes available from Cree, Inc. the assignee herein, or light emitting diodes with both contacts on the top side (i.e.; without conductive substrates).

The invention can also be advantageous in conjunction with n-type conductive layers grown at relatively low temperature such as the dots 26 in FIG. 2 in vertically conducting silicon carbide-based Group III nitride light emitting diodes.

The invention modifies the stress in the film to reduce cracking and improves doping efficiency at temperatures below about 900 degrees centigrade.

Accordingly, in another aspect, the invention is a method of forming light emitting diodes in Group III nitride materials with higher efficiency but at lower temperatures than commonly used. In this aspect the invention comprises a growing the respective epitaxial layers of Group III nitride material using chemical vapor deposition at temperatures below about 900° C. while doping at least one of the n-type layers with a dopant selected from the group consisting of germanium and tellurium.

The step of doping the n-type layers comprises doping the layers with sources selected from the group consisting of germanium-containing source gases, tellurium-containing source gases, and combinations thereof.

Germane ($GeH_4$) is a typical source gas for germanium, is commercially available and is familiar to those of skill in this art and can be used in the invention without undue experimentation.

A common tellurium-containing source gas is typically diisopropyl tellurium ($C_6H_{14}Te$), diethyl tellurium ($C_4H_{10}Te$), or combinations thereof.

The source gases can be introduced in any manner conventional to chemical vapor deposition and does not require specialized handling. The basic parameters and techniques of chemical vapor deposition are well understood and individual systems can be (and in some cases should be) customized or individually adjusted as necessary to obtain the desired result. Such adjustments are, however, well within the ordinary skill of persons in this art and can be carried out without undue experimentation.

The method is typically carried out on a silicon carbide substrate, although it can also be carried out on sapphire substrates. When carried out on a silicon carbide substrate, the method will typically include growing at least one buffer layer between the silicon carbide substrate and one of the adjacent Group III nitride active layers.

Although the term "buffer layer" is used in a singular context, it will be understood that the buffer can incorporate multiple layers to the same effect, and again within the capabilities of the person of ordinary skill in this art.

As a particular advantage, the method comprises growing the germanium or tellurium doped the layers to greater thickness on the underlying epitaxial layers or substrate than would be possible when using a doping species of smaller atomic number and correspondingly smaller covalent radius. An example of such a smaller dopant species is silicon. As noted in elsewhere herein, replacing the typical silicon doping with germanium or tellurium doping permits thicker layers to be produced with less strain than corresponding layers of similar thicknesses that are doped with silicon.

Although the invention has been described primarily with respect to germanium and tellurium, it will be understood that other elements are acceptable dopants provided they offer the same beneficial criteria as germanium and tellurium in the context of doping Group III nitride layers to reduce strain. Thus, in addition to having atomic or covalent radii greater than silicon, qualifying elements will also act as an n-type dopants in the Group III nitrides, should be available in an appropriate source gas for chemical vapor deposition techniques; and must avoid pre-reacting with the other elements under Group III nitride growth conditions. The available source molecules for the element (e.g., germane is the source molecule for germanium) must be stable; the element and its source molecule should avoid memory issues in growth equipment; and the element should have a relatively low binding energy. In this regard, binding energy typically decreases in relation to increasing atomic number (and thus size), a factor which is consistent with respect to silicon, germanium, and tellurium.

Furthermore, although the issues of tension and compression generally arise in the context of adjacent layers that are different from one another, impurities—including dopants—can cause strain even in otherwise homogeneous materials and even in the absence of an adjacent different material.

It will also be understood that the doping with the larger-than-silicon dopants need not necessarily be exclusive, for example, in order to adjust the strain in a layer or between layers. Thus, the invention includes Group III nitride layers that include both silicon and one of the larger atoms as co-dopants, Group III nitride layers that are graded in their doping (i.e., the relative amount of silicon doping and larger atom doping progressively changes across the layer); and adjacent Group III nitride layers in which one of the Group III nitride layers is doped with silicon and the adjacent Group III nitride layer is doped with one of the larger atoms such as germanium or tellurium.

In the drawings and specification there has been set forth a preferred embodiment of the invention, and although specific terms have been employed, they are used in a generic and descriptive sense only and not for purposes of limitation, the scope of the invention being defined in the claims.

The invention claimed is:

1. In a light emitting diode formed in the Group III nitride material system that includes respective n-type and p-type layers for current injection and light emission; the improvement comprising:
    an n-type Group III nitride layer comprising dopants selected from the group consisting of germanium and tellurium; and
    said n-type Group III nitride layer doped with germanium or tellurium having a thickness that is between two boundaries:
    an upper boundary defined by the maximum thickness at which said n-type Group III nitride layer when doped with germanium or tellurium is pseudomorphic on a defined growth substrate; and
    a lower boundary defined by the maximum thickness at which the same n-type Group III nitride layer when doped only with silicon is pseudomorphic on the same defined growth substrate.

2. A light emitting diode according to claim 1 comprising:
    a Group III nitride emission layer on said n-type Group III nitride layer; and
    a p-type Group III nitride on said Group III nitride emissions layer for providing a p-n junction structure for current injection through the device and generating an emission.

3. A light emitting diode according to claim 1 wherein said n-type Group III nitride layer is selected from the group consisting of gallium nitride, indium nitride, aluminum gallium nitride, and aluminum indium gallium nitride.

4. A light emitting diode according to claim 2 further comprising respective ohmic contacts to said p-type Group III nitride and said n-type Group III nitride layer.

5. A light emitting diode according to claim 4 wherein said n-type Group III nitride layer is supported by a conductive n-type silicon carbide substrate and said ohmic contact to said n-type layer is made to said n-type silicon carbide substrate.

6. A light emitting diode comprising:
    a silicon carbide substrate;
    a Group III nitride buffer structure on said silicon carbide substrate;
    an n-type Group III nitride epitaxial layer on said buffer structure;
    a Group III nitride superlattice structure on said n-type Group III nitride epitaxial layer;
    said n-type Group III nitride epitaxial layer in said diode being doped with a dopant selected from the group consisting of germanium and tellurium; and
    said n-type Group III nitride epitaxial layer doped with germanium or tellurium having a thickness that is between two boundaries:
    an upper boundary defined by the maximum thickness at which said n-type Group III nitride epitaxial layer when doped with germanium or tellurium is pseudomorphic on a defined growth substrate; and
    a lower boundary defined by the maximum thickness at which the same n-type Group III nitride layer when doped only with silicon is pseudomorphic on the same defined growth substrate.

7. A light emitting diode according to claim 6 wherein said superlattice comprises a series of at least two alternating strained layers of Group III nitride materials.

8. A light emitting diode according to claim 6 wherein said n-type Group III nitride layer comprises gallium nitride.

9. A light emitting diode according to claim 6 wherein said buffer structure includes an n-type layer of aluminum gallium nitride between said substrate and said n-type Group III nitride epitaxial layer.

10. A light emitting diode according to claim 9 wherein said n-type layer of aluminum gallium nitride is doped with germanium or tellurium.

11. A light emitting diode according to claim 10 in which said aluminum gallium nitride buffer layer is graded in its atomic percentage of aluminum between said substrate and said n-type Group III nitride epitaxial layer.

12. A light emitting diode according to claim 6 wherein said buffer structure includes a plurality of discontinuous portions of Group III nitride material for enhancing the structural and electronic transition between said silicon carbide substrate and said n-type Group III nitride epitaxial layer.

13. A light emitting diode according to claim 12 wherein said discontinuous portions comprise gallium nitride dots.

14. A light emitting diode according to claim 6 wherein said buffer structure includes both a graded layer of aluminum gallium nitride and a homogeneous layer of aluminum gallium nitride between said substrate and said n-type Group III nitride epitaxial gallium nitride layer.

15. A light emitting diode according to claim 6 comprising ohmic contacts to said n-type Group III nitride epitaxial layer and said superlattice for injecting current through said diode.

16. A light admitting diode according to claim 15 in a vertical orientation with one of said ohmic contracts on said silicon carbide substrate and the other of said ohmic contacts to said superlattice opposite said substrate.

17. A light emitting diode according to claim 15 comprising two top side ohmic contacts.

18. In a light emitting diode formed in the Group III nitride material system that includes respective n-type and p-type layers for current injection and light emission; the improvement comprising:
    an n-type Group III nitride layer that includes silicon and a dopant selected from the group consisting of elements with a larger atomic radius than silicon and elements with a larger covalent radius than silicon; and
    said n-type Group III nitride layer having a thickness that is between two boundaries:
    an upper boundary defined by the maximum thickness at which said n-type Group III nitride layer is pseudomorphic on a defined growth substrate; and
    a lower boundary defined by the maximum thickness at which the same n-type Group III nitride layer when doped only with silicon is pseudomorphic on the same defined growth substrate.

19. A light emitting diode according to claim 18 wherein said group of elements with larger radius comprises germanium and tellurium.

20. A light emitting diode according to claim 18 wherein the relative amount of silicon doping and larger atom doping progressively changes across said n-type Group III nitride layer.

21. A semiconductor device, comprising:
    at least one n-type Group III nitride layer that includes silicon and a dopant having at least one characteristic selected from the group consisting of a larger atomic radius than silicon and a larger covalent radius than silicon.

22. A semiconductor device according to claim 21 wherein a relative amount of said silicon and said dopant progressively changes across said at least one Group III nitride layer.

* * * * *